United States Patent
Gong et al.

(10) Patent No.: US 11,632,113 B2
(45) Date of Patent: Apr. 18, 2023

(54) ENABLE CONTROL CIRCUIT AND SEMICONDUCTOR MEMORY

(71) Applicant: CHANGXIN MEMORY TECHNOLOGIES, INC., Hefei (CN)

(72) Inventors: Yuanyuan Gong, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/650,500

(22) Filed: Feb. 9, 2022

(65) Prior Publication Data

US 2023/0021070 A1 Jan. 19, 2023

Related U.S. Application Data

(63) Continuation of application No. PCT/CN2021/116997, filed on Sep. 7, 2021.

(30) Foreign Application Priority Data

Jul. 9, 2021 (CN) .......................... 202110776925.5

(51) Int. Cl.
*H03K 21/00* (2006.01)
*H03K 21/38* (2006.01)
*G11C 11/4076* (2006.01)
*H03K 23/58* (2006.01)

(52) U.S. Cl.
CPC .......... *H03K 21/38* (2013.01); *G11C 11/4076* (2013.01); *H03K 23/58* (2013.01)

(58) Field of Classification Search
CPC .... H03K 21/38; H03K 23/58; H03K 19/0005; H03K 19/017545; H03K 19/01825; H03K 19/018557
See application file for complete search history.

(56) References Cited

U.S. PATENT DOCUMENTS

| | | | | |
|---|---|---|---|---|
| 2007/0085562 A1* | 4/2007 | Nguyen | .............. | H04L 25/0298 326/30 |
| 2008/0122450 A1* | 5/2008 | Yokou | .................. | G11C 29/028 324/601 |
| 2009/0146694 A1* | 6/2009 | Kim | ........................ | H03K 5/153 341/155 |
| 2013/0076399 A1* | 3/2013 | Jeong | ..................... | H03K 5/249 327/77 |

FOREIGN PATENT DOCUMENTS

CN 101800075 A 8/2010

\* cited by examiner

*Primary Examiner* — Tuan T Lam
(74) *Attorney, Agent, or Firm* — Syncoda LLC; Feng Ma

(57) ABSTRACT

An enable control circuit, which includes a counter circuit configured to count a current clock cycle and determine a clock cycle count value; a selection circuit configured to determine a clock cycle count target value according to a first setting signal; and a control circuit configured to control an ODT path to be enabled and start the counter circuit when the voltage level of an ODT pin signal is flipped over, control the ODT path to be switched from being enabled to disabled when the clock cycle count value reaches the clock cycle count target value and the voltage level of the ODT pin signal is not changed, and control the ODT path continue to be enabled when the clock cycle count value reaches the clock cycle count target value and the voltage level of the ODT pin signal flips again.

20 Claims, 14 Drawing Sheets

ENABLE CONTROL CIRCUIT AND SEMICONDUCTOR MEMORY

CROSS-REFERENCE TO RELATED APPLICATIONS

This is a continuation of International Application No. PCT/CN2021/116997 filed on Sep. 7, 2021, which claims priority to Chinese Patent Application No. 202110776925.5 filed on Jul. 9, 2021. The disclosures of these applications are hereby incorporated by reference in their entirety.

BACKGROUND

With the continuous development of semiconductor technology, people have increasingly higher requirements for data transmission speed when manufacturing and using computers and other devices. In order to obtain faster data transmission speed, a series of devices such as memories which can transmit data at DDR (Double Data Rate) came into being.

In the design of data transmission at DDR, the rule of ODT (On Die Termination) is added. To put it simply, the resistance value of RTT (Termination Resistance) can be switched, and how to switch needs to follow a certain sequence. For example, the state of an ODT pin on a memory chip can control the value of the RTT.

SUMMARY

The disclosure relates to, but is not limited to, an enable control circuit and a semiconductor memory.

In a first aspect, embodiments of the disclosure provide an enable control circuit, including: a counter circuit, a selection circuit and a control circuit.

The counter circuit is configured to count a current clock cycle and determine a clock cycle count value.

The selection circuit is configured to determine a clock cycle count target value according to a first setting signal.

The control circuit is connected to the counter circuit and the selection circuit, and is configured to control an ODT path to be enabled and start the counter circuit when the voltage level of an ODT pin signal is flipped over, control the ODT path to be switched from being enabled to disabled when the clock cycle count value reaches the clock cycle count target value and the voltage level of the ODT pin signal is not switched, and control the ODT path to continue to be enabled when the clock cycle count value reaches the clock cycle count target value and the voltage level of the ODT pin signal is flipped over again.

In a second aspect, embodiments of the disclosure provide a semiconductor memory including an enable control circuit as described in the first aspect.

DETAILED DESCRIPTION

Figure 1:
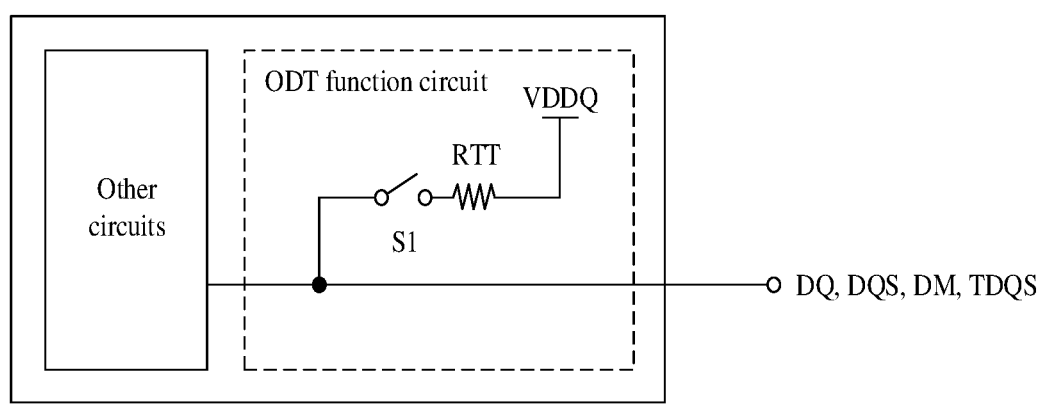
FIG. 1 illustrates a schematic structural diagram of an ODT function circuit provided in some implementations.

The technical scheme of the embodiments of the disclosure will be clearly and completely described below with reference to the drawings of the embodiments of the disclosure. It should be understood that the specific embodiments described herein are merely illustrative of the relevant disclosure and are not limiting of the disclosure. It should be further noted that, for the convenience of description, only parts relevant to the related disclosure are shown in the drawings.

Unless otherwise defined, all terms (including technical and scientific terms) used herein have the same meaning as commonly understood by those of ordinary skill in the art to which the disclosure belongs. The terms used herein are merely for the purpose of describing the embodiments of the disclosure and are not intend to limit the disclosure.

In the following description, "some embodiments" describe subsets of all possible embodiments, but it should be understood that "some embodiments" may be same or different subsets of all possible embodiments, and may be combined with each other on a non-conflict basis.

It should be noted that terms "first/second/third" are used merely to distinguish similar objects and do not denote particular sequencing, and it should be understood that "first/second/third" may be interchanged under appropriate circumstances in order to enable the embodiments of the disclosure described herein to be implemented in other sequences than those illustrated or described herein.

Prior to further detailed description of the embodiments of the disclosure, nouns and terms referred to in the embodiments of the disclosure will be explained, and the nouns and terms referred to in the embodiments of the disclosure are applicable for the following explanation:

Dynamic Random Access Memory (DRAM)
Double Data Rate (DDR)
4th DDR (DDR4)
On Die Termination (ODT)
Termination Resistance (RTT)
CAS Write Latency (CWL)
CAS Latency (CL)
Additive Latency (AL)
Parity Latency (PL)
Delay-Locked Loop (DLL)
Mode Register (MR)
Mode Register Set (MRS)

The enable state of an ODT path cannot be accurately controlled, resulting in current waste, thereby increasing power consumption; and even when the voltage level of the ODT pin is flipped over for two consecutive times, the ODT path cannot be enabled when the voltage level of the ODT pin is flipped over for the second time in some cases.

With rapid development of the semiconductor technology, the signal transmission rate has become increasingly faster, which leads to the problem of signal integrity becoming increasingly prominent. In the process of high-speed signal transmission, in order to better improve the signal integrity of data, ODT resistance is added separately in DDR3 and DDR4 designs, i.e., ODT resistance is used to match the impedance of transmission lines, which reduces energy loss and reflection of signals in the transmission process, thereby ensuring the integrity of signals received by receiving terminals.

Taking a DDR4 DRAM as an example, the DDR4 DRAM supports ODT function. The ODT function can adjust RTT of DQ, DQS_t/c, DM_n and TDQS_t/c ports of each device through ODT pin control, write commands or setting default resistance in MR (Mode Register). In addition, the ODT function is designed to reduce reflection and effectively improve signal integrity on a memory interface by independently controlling the RTT of all or any one of DRAMs by a controller. As shown in FIG. 1, FIG. 1 illustrates a schematic structural diagram of an ODT function circuit provided in some implementations. As shown in FIG. 1, the ODT function circuit may at least include a switch S1, RTT, and a power supply VDDQ. One terminal of the switch S1 is connected to one terminal of the RTT, the other terminal of the RTT is connected to the power supply VDDQ, and the other terminal of the switch S1 is connected to other circuits and DQ, DQS, DM and TDQS ports. It should be noted that DQSs (Data Strobe Signal) may be a pair of differential data strobe signals DQS_t and DQS_c, and TDQSs may be a pair of differential data strobe signals TDQS_t and TDQS_c. In other words, the DDR4 DRAM only supports differential signals as the data strobe signals, and does not support single signal as the data strobe signal.

In addition, the switch S1 in FIG. 1 is controlled by ODT control logic. The ODT control logic includes external ODT pin input, MRS, and other control information. The value of RTT is controlled by the configuration information in the MR. In addition, if RTT_NOM is disabled in an SR (Self-Refresh) mode or MR1{A10, A9, A8}={0, 0, 0}, control of the ODT pin is ignored.

Specifically, the ODT function of the DDR4 DRAM has four states: RTT disabled, RTT_WR, RTT_NOM and RTT_PARK. The ODT function is enabled when not all of the configuration bits MR1{A10, A9, A8} or MR2{A10: A9} or MR5{A8: A6} are 0. In such case, the actual value of ODT resistance is determined by the configuration bits. After being in the self-refresh mode, the DDR4 DRAM automatically disables ODT function and sets all RTT to Hi-Z state to discard all MRS.

It should be further noted that embodiments of the disclosure provide a synchronous ODT mode. When a DLL is enabled and locked, the synchronous ODT mode can be selected. In the synchronous ODT mode, RTT_NOM is enabled after DODTLon clock cycles after an ODT pin signal is switched to high voltage level and is sampled by a first rising edge of the clock; and RTT_NOM is disabled after DODTLoff clock cycles after the ODT pin signal is switched to low voltage level and is sampled by the first rising edge of the clock. The parameters DODTLon and DODTLoff are related to WL (WL=CWL+AL+PL), DODTLon=WL−2, and DODTLoff=WL−2.

In the synchronous ODT mode, AL and PL also directly affect the latency of the ODT (which can also be called "delay"), as shown in Table 1.

TABLE 1

| Symbol | Parameter | DDR4-1600/1866/2133/2400/2666/3200 | Unit |
|---|---|---|---|
| DODTLon | ODT enable latency is directly affected | CWL + AL + PL−2.0 | Clock cycle/tck |
| DODTLoff | ODT disable latency is directly affected | CWL + AL + PL−2.0 | Clock cycle/tck |

Figure 2:
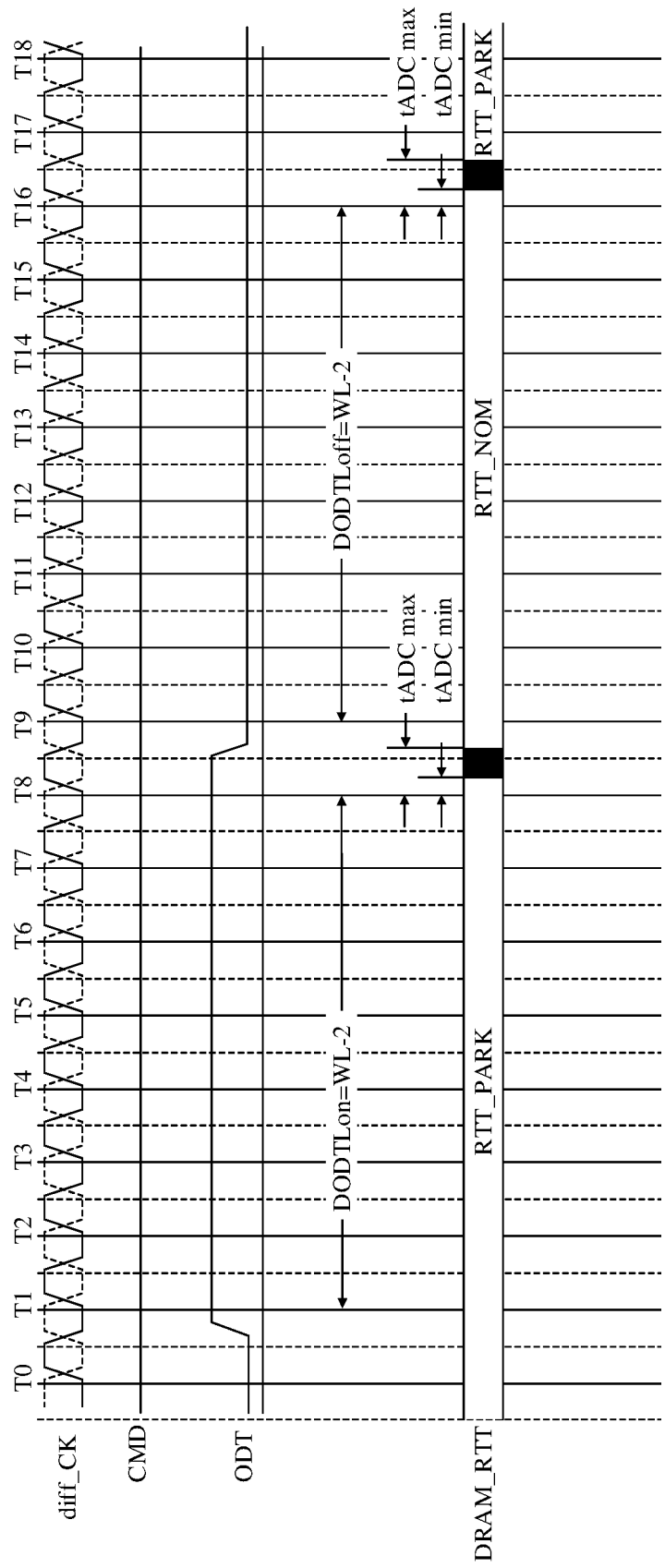
FIG. 2 illustrates a schematic sequential diagram in a synchronous ODT mode provided in some implementations.

Further, in the synchronous ODT mode, the following sequence parameters are applicable: DODTLon, DODTLoff, tADC min, tADC max, and so on. When the ODT resistance is switched, for example, from RTT_PARK to RTT_NOM, the maximum and minimum values of the jitter values of RT time shifting are: tADC max and tADC min, and the parameters are applicable to the synchronous ODT mode and data RTT disabled mode. With reference to FIG. 2, FIG. 2 illustrates a schematic sequential diagram in a synchronous ODT mode provided in some implementations. As shown in FIG. 2, assuming that CWL=9, AL=0, and PL=0, DODTLon=WL−2=7, and DODTLoff=WL−2=7. In addition, the black part in FIG. 2 is the jitter value of the RTT time shifting.

It should be understood that the foregoing shows the relevant provisions for ODT in the technical specifications of the DDR4. To put it simply, the value of RTT can be switched, but how to switch needs to follow a certain sequence. One of the modes is the synchronous ODT mode. That is, the voltage level of an ODT pin signal on a DRAM chip controls the value of the RTT. When the ODT pin signal is switched from low to high, and after waiting for DODTLon clock cycles, the value of the RTT of the DRAM chip is switched from RTT_PARK to RTT_NOM; or, when the ODT pin signal is switched from high to low, and after waiting for DODTLoff clock cycles, the value of the RTT of the DRAM chip is switched from RTT_NOM to RTT_PARK.

It should be noted that the sequence DODTLon and DODTLoff, i.e., ODT latency, are related to the values of CWL, AL and PL. Therefore, a shift register needs to be set in the ODT path to shift multiple clock cycles, so as to realize the sequence requirements related to CWL, AL and PL. In addition, the shift register requires a clock signal (which can be denoted by CLK).

Figure 3:
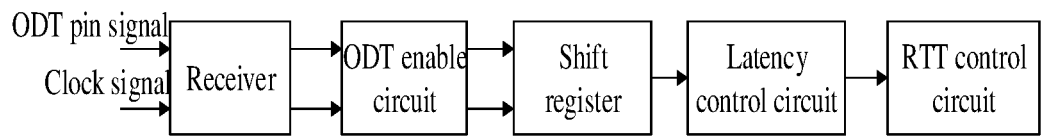
FIG. 3 illustrates a schematic framework diagram of controlling an ODT path to work according to embodiments of the disclosure.

As shown in FIG. 3, FIG. 3 illustrates a schematic framework diagram of controlling an ODT path to work according to embodiments of the disclosure. As shown in FIG. 3, a receiver, an ODT enable circuit, a shift register, a latency control circuit, and an RTT control circuit are included. The receiver is configured to receive an ODT pin signal and a clock signal, and the RTT control circuit is configured to control the switch of RT values. In addition, the whole ODT path is a very complex path, which includes physical delay (independent of clock cycle) and clock delay (which is an integer multiple of the clock cycle). As shown in FIG. 3, the delay of the whole path is an integer multiple of the clock cycle, i.e., DODTLon and DODTLoff. Therefore, the function of the latency control circuit is to use DLL to synchronize the signal at the terminal of ODT path (i.e., the control signal of switch S1 as shown in FIG. 1) with the clock signal, so that the delay of the whole path is an integer multiple of the clock cycle by compensating the physical delay, and finally value control of RTT is realized.

In some implementations, the ODT enable circuit mainly adopts simple logic control. As shown in Table 2, whether the CLK, which is used by the ODT path, is enabled and disabled is controlled by identifying whether the synchronous ODT mode in MRS is enabled or disabled. For example, if MR1<A10:A8> is set to be disabled, the voltage level of the ODT pin signal will not work, and the ODT path and CLK are not needed, so CLK can be disabled, and then the ODT path can be disabled, thereby saving power.

However, as shown in Table 2, there is still a situation in which MRS is enabled, but the voltage level of the ODT pin signal is not changed; and in such case, the ODT path does not need to work. However, since CLK is not disabled, current is wasted and power consumption is increased.

TABLE 2

| RTT_PARK<br>MR5 {A8: A6} | RTT_NOM<br>MR1{A10:A9:A8} | ODT Pin | DRAM End State |
| --- | --- | --- | --- |
| Enabled | Enabled | High | RTT_NOM |
| | | Low | RTT_PARK |
| | Disabled | Does not work | RTT_PARK |
| Disabled | Enabled | High | RTT_NOM |
| | | Low | Hi-Z |
| | Disabled | Does not work | Hi-Z |

Figure 4:
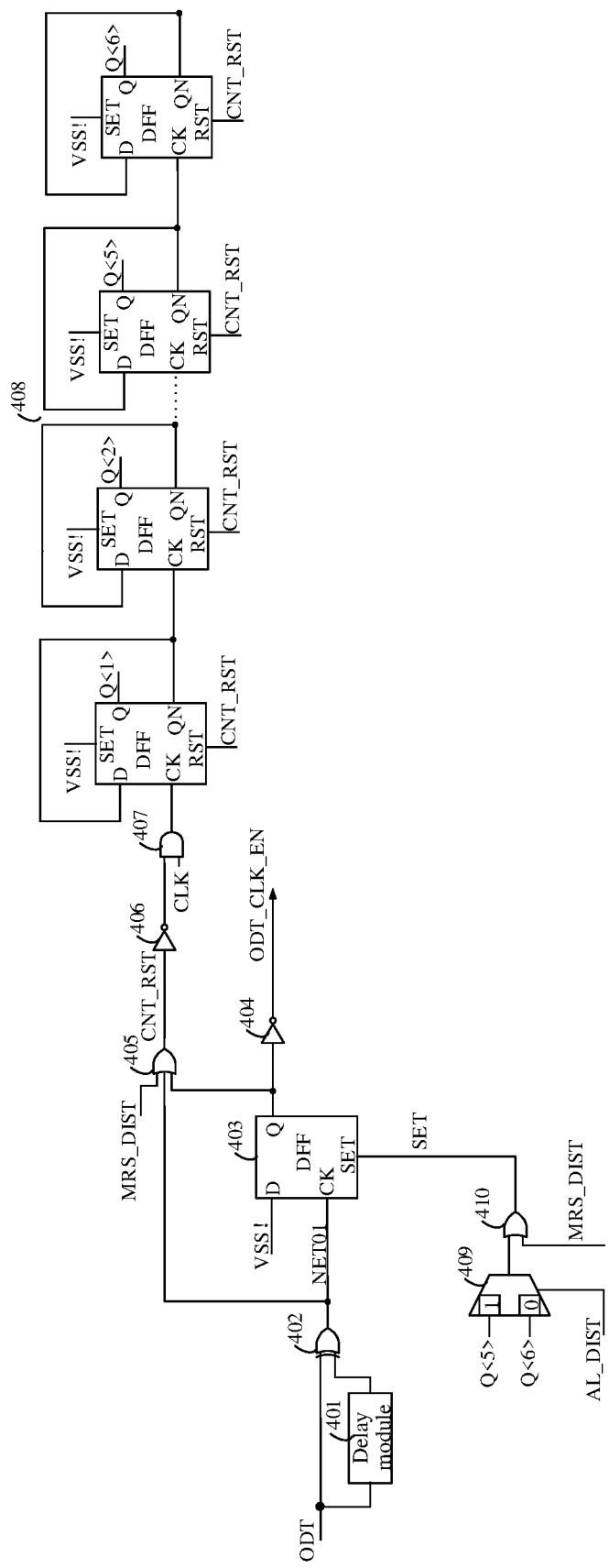
FIG. 4 illustrates a specific schematic structural diagram of an enable control circuit provided in some implementations.

Illustratively, with reference to FIG. 4, FIG. 4 illustrates a specific schematic structural diagram of an enable control circuit provided in some implementations. As shown in FIG. 4, the enable control circuit may include a delay circuit 401, an XOR gate 402, a first flip-flop 403, a first NOT gate 404, a three-input OR gate 405, a second NOT gate 406, a two-input AND gate 407, six second flip-flops 408, a selection circuit 409, a two-input OR gate 410, and the like. A signal output by the XOR gate 402 is denoted by NET01; a signal output by the first NOT gate 404 is denoted by ODT_CLK_EN; a signal output by the three-input OR gate 405 is denoted by CNT_RST; an asynchronous binary counter may be consisted of six second flip-flops 408, and signals output by first output terminals (Q) of the six second flip-flops 408 are denoted by Q<1>, Q<2>, . . . , Q<5>, Q<6> in turn; and a signal output by the two-input OR gate 410 is denoted by SET. In addition, an ODT pin signal is denoted by ODT, a clock signal is denoted by CLK, a global grounding signal is denoted by VSS!; and AL_DIST may denote a first setting signal and is generated according to whether AL and/or PL are/is enabled; and MRS_DIST may denote a second setting signal and is generated according to the MRS.

Figure 5:
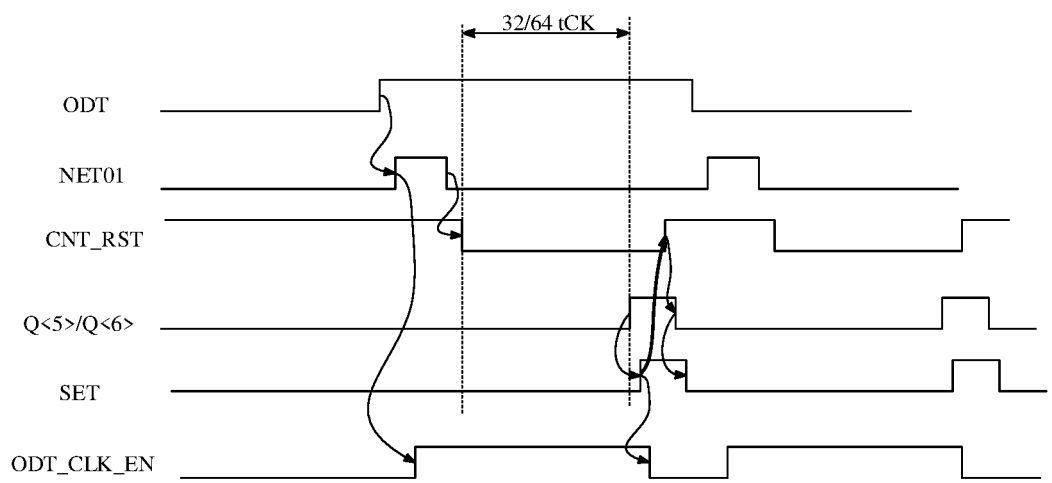
FIG. 5 illustrates a schematic sequential diagram of an enable control circuit provided in some implementations.

According to the circuit structure shown in FIG. 4, the corresponding signal sequential diagram is shown in FIG. 5. As shown in FIG. 5, the curves with arrows denote the causal relationship. For example, when the ODT pin signal is switched from low voltage level to high voltage level, the NET01 signal is switched from low voltage level to high voltage level through the delay circuit 401 and the XOR gate 402. The first flip-flop 403 (i.e., D flip-flop) is triggered at the moment when the NET01 signal is switched from low voltage level to high voltage level, the input of a D terminal is sampled as the output of a Q terminal, and then, the output of the Q terminal is at low voltage level and is switched to high voltage level after passing through the first NOT gate 404, i.e. the ODT_CLK_EN signal is switched from low voltage level to high voltage level, so that the ODT path is enabled. When the MRS_DIST signal is at low voltage level, and when the NET01 signal is switched from high voltage level to low voltage level, the output signal of the Q terminal of the first flip-flop 403 is at low voltage level, and the foregoing three signals are input to the three-input OR gate 405 to output the signal at low voltage level, i.e., the CNT_RST signal is switched from high voltage level to low voltage level. Then, the asynchronous binary counter starts to count, and after the clock cycle count value satisfies 32 or 64 clock cycles (tCK), the Q<5> or Q<6> signal is switched from low voltage level to high voltage level, which, together with the MRS_DIST signal, are input to the two-input OR gate 410, and the SET signal is output, which is switched from low voltage level to high voltage level. Further, when the SET signal is at high voltage level, the first flip-flop 403 is set so that the output signal of the Q terminal of the first flip-flop 403 is at high voltage level, and is switched to low voltage level after passing through the first NOT gate 404, i.e., the ODT_CLK_EN signal is switched from high voltage level to low voltage level, so that the ODT path is disabled, thereby achieving the purpose of saving power.

In some embodiments of the disclosure, the high voltage level is, for example, a state that higher than or equal to the supply voltage, and the low voltage is, for example, a state that lower than or equal to the ground voltage. Herein, the specific voltage range of the high voltage level and the specific voltage range of the low voltage level depend on specific devices. For example, for the N-type Field Effect Transistor (FET), the high voltage level refers to a gate voltage range that enables the N-type FET to be turned on, and the low voltage level refers to a gate voltage range that enables the N-type FET to be turned off. For the P-type FET, the high voltage level refers to a gate voltage range that enables the P-type FET to be turned off, and the low voltage level refers to a gate voltage range that enables the P-type FET to be turned on.

Figure 6:
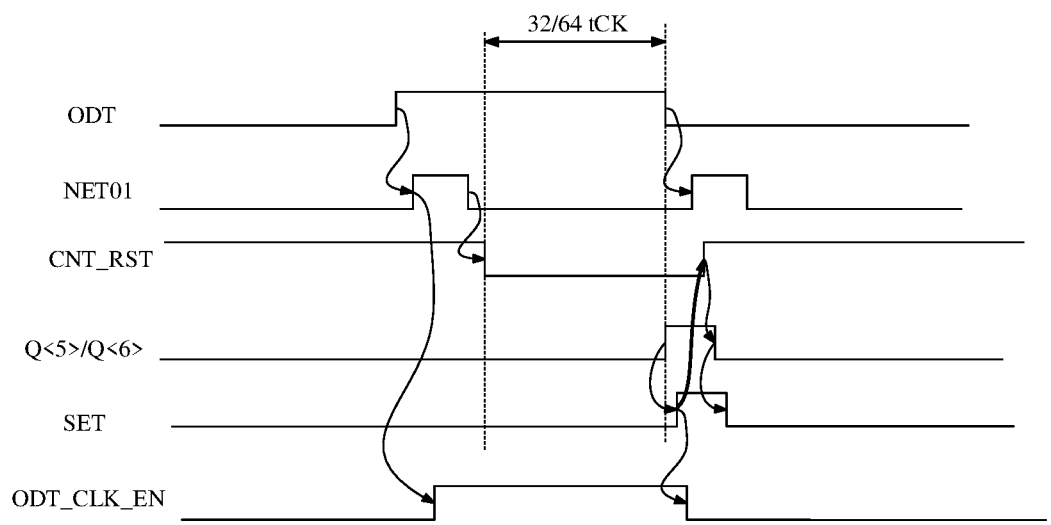
FIG. 6 illustrates a schematic sequential diagram of another enable control circuit provided in some implementations.

However, a problem exist in the circuit structure as shown in FIG. 4, i.e., when the voltage level of the ODT pin signal is switched for two consecutive times and the interval is about 32 tCK or 64 tCK, a situation will be caused that the voltage level of the ODT pin signal is switched for the second time, but the ODT path cannot be enabled, as shown in the sequential diagram shown in FIG. 6.

As shown in FIG. 6, when the voltage level of the ODT pin signal is switched for about 32 tCK or 64 tCK after the first time of switch (depending on whether AL and/or PL are/is enabled), the voltage level of the ODT pin signal is switched for the second time, which causes the rising edge of the NET01 signal to be right in the middle of a pulse of the SET signal generated by the first switch of the voltage level of the ODT pin signal, and therefore the rising edge of the NET01 signal cannot work, and the ODT_CLK_EN signal cannot be switched to high voltage level, which in turn causes the ODT path to fail to be enabled. In short, at this special moment, after the voltage level of the ODT pin signal is switched for the first time, the ODT path delay has been completed, and the ODT_CLK_EN signal is expected to be at low voltage level and the ODT path is expected to be disabled. However, just at this moment, the voltage level of the ODT pin signal is switched for the second time, and the ODT_CLK_EN signal is expected to be at high voltage level to enable the ODT path, but the enabling fails.

Thereon, embodiments of the disclosure provides an enable control circuit, and the enable control circuit can not only enable an ODT path within a certain time after detecting the voltage level switch of an ODT pin signal, i.e., the ODT path is enabled; and moreover, after ensuring that the change of resistance value of RTT is completed, the ODT path can be disabled, thereby achieving the purpose of saving power. In addition, when the voltage level of the ODT pin signal is flipped over for two consecutive times, the problem that the ODT path cannot be enabled when the voltage level of the ODT pin signal is flipped over for the second time in some cases can also be solved.

Embodiments of the disclosure will be described in detail below with reference to the drawings.

Figure 7:
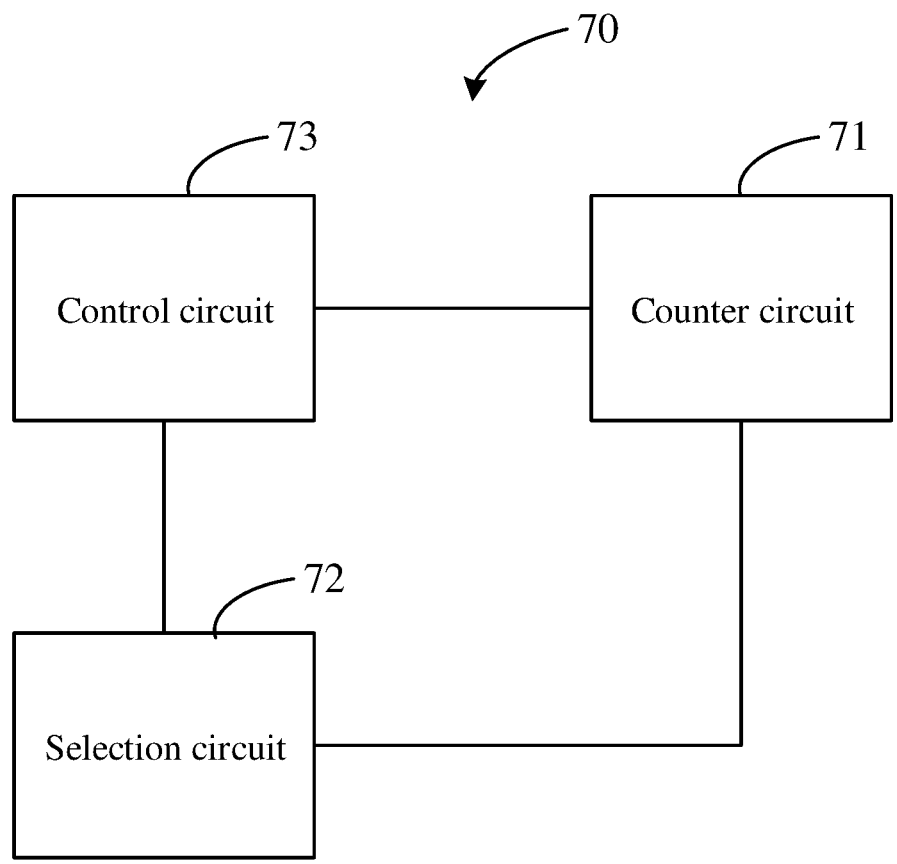
FIG. 7 illustrates a schematic structural diagram of components of an enable control circuit according to embodiments of the disclosure.

According to an embodiment of the disclosure, with reference to FIG. 7, FIG. 7 illustrates a schematic structural diagram of components of an enable control circuit 70 according to embodiments of the disclosure. As shown in FIG. 7, the enable control circuit 70 may include a counter circuit 71, a selection circuit 72 and a control circuit 73.

The counter circuit 71 is configured to count a current clock cycle and determine a clock cycle count value.

The selection circuit 72 is configured to determine a clock cycle count target value according to a first setting signal.

The control circuit 73 is connected to the counter circuit 71 and the selection circuit 72, and is configured to control an ODT path to be enabled and start the counter circuit when the voltage level of an ODT pin signal is flipped over, control the ODT path to be switched from being enabled to disabled when the clock cycle count value reaches the clock cycle count target value and the voltage level of the ODT pin signal is not changed, and control the ODT path to continue to be enabled when the clock cycle count value reaches the clock cycle count target value and the voltage level of the ODT pin signal is flipped over again.

It should be noted that the enable control circuit 70 according to the embodiments of the disclosure is applied to the ODT enable circuit as shown in FIG. 3. Herein, if the voltage level of the ODT pin signal is flipped over, such as switching from low voltage level to high voltage level or from high voltage level to low voltage level, the value of RTT will be switched after delaying for DODTLon tck or DODTLoff tck, during which the ODT path needs to be controlled to be enabled; and then, after the value switch of RTT is completed, in order to save power consumption, the ODT path can be controlled to be switched from being enabled to disabled.

It should also be noted that in order to ensure that the value switch of RTT is completed, according to the embodiments of the disclosure, a clock cycle count target value can be set, which is related to DODTLon or DODTLoff. Since both DODTLon and DODTLoff are related to CWL, AL and PL, i.e., the setting of clock cycle count target value is related to CWL, AL and PL. According to the embodiments of the disclosure, the first setting signal is generated according to whether AL and/or PL are/is enabled, so that the selection circuit 72 can determine the clock cycle count target value according to whether AL and/or PL are/is enabled.

It should be further noted that, for the enable control circuit 70, when the voltage level of the ODT pin signal is flipped over for two consecutive times, especially when the voltage level of the ODT pin signal is flipped over for the second time at some time, the interval of which is around the clock cycle count target value, the ODT path can still be ensured to be enabled then.

Therefore, the counter circuit 71 can determine whether the clock cycle count value reaches the clock cycle count target value, the selection circuit 72 can determine the clock cycle count target value, and then the control circuit 73 can control the ODT path to be enabled and start the counter circuit when the voltage level of the ODT pin signal is flipped over. When the clock cycle count value reaches the clock cycle count target value and the voltage level of the ODT pin signal is not switched, the ODT path is controlled to be switched from being enabled to disabled. When the clock cycle count value reaches the clock cycle count target value and the voltage level of the ODT pin signal is flipped over again, the ODT path is controlled to continue to be enabled, so that power can be saved and the problem that the ODT path cannot be enabled when the voltage level of the ODT pin signal is flipped over for the second time in some cases can be solved.

Figure 8:
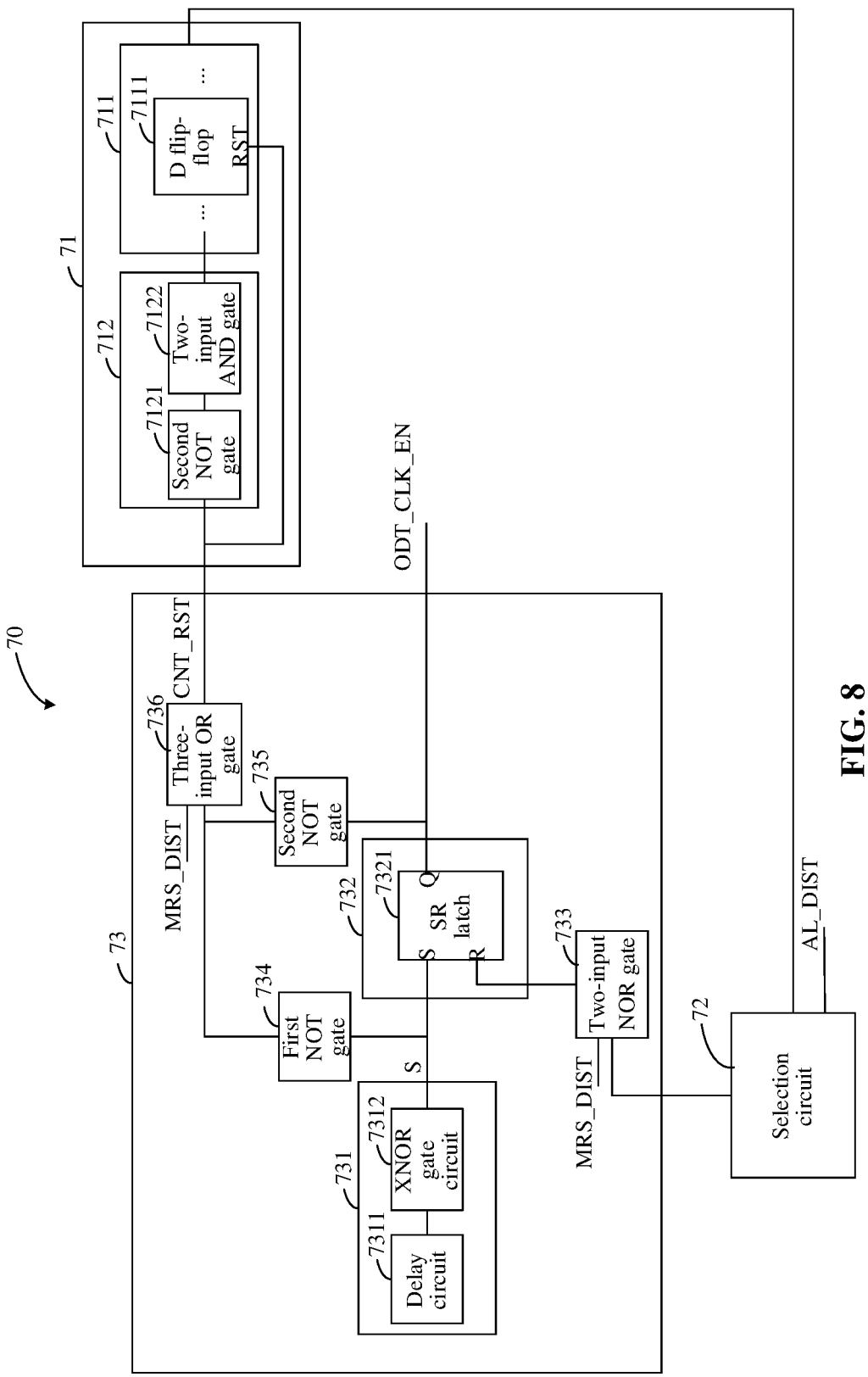
FIG. 8 illustrates a schematic structural diagram of components of another enable control circuit according to embodiments of the disclosure.

According to some embodiments, based on the enable control circuit 70 shown in FIG. 7 and with reference to FIG. 8, a control circuit 73 may include a first control sub-circuit 731 and a second control sub-circuit 732.

The first control sub-circuit 731 is configured to generate a first intermediate signal according to an ODT pin signal.

The second control sub-circuit 732 is configured to perform operation on the first intermediate signal to generate an ODT enable signal.

Herein, for the first intermediate signal, the first intermediate signal may be denoted by S. Before the voltage level of the ODT pin signal is flipped over, the first intermediate signal is at first voltage level; the first intermediate signal is switched from first voltage level to second voltage level within preset time after the voltage level of the ODT pin signal is flipped over; and after the preset time, the first intermediate signal is switched from second voltage level to first voltage level.

For the ODT enable signal, the ODT enable signal can be denoted by ODT_CLK_EN. The ODT enable signal may include: when the ODT enable signal is at third voltage level, the ODT path is controlled to be enabled; and when the ODT enable signal is at fourth voltage level, the ODT path is controlled to be disabled.

According to a specific embodiment, the first voltage level may be high voltage level, the second voltage level may be low voltage level, the third voltage level may be high voltage level, and the fourth voltage level may be low voltage level.

Further, according to some embodiments as shown in FIG. 8, a first control sub-circuit 731 may include a delay circuit 7311 and an XNOR gate circuit 7312.

The delay circuit 7311 is configured to delay an ODT pin signal for preset time to obtain an ODT time-delayed signal.

The XNOR gate circuit 7312 is configured to perform XNOR operation on the ODT pin signal and the ODT time-delayed signal to obtain a first intermediate signal.

Herein, the preset time is the time that the ODT pin signal is delayed by the delay circuit 7311, and the preset time can also control the pulse width of the first intermediate signal. In addition, the XNOR gate circuit 7312 may also be referred to as an XOR-NOT gate circuit which may be considered as consisting of an XOR gate and a NOT gate.

Figure 9:
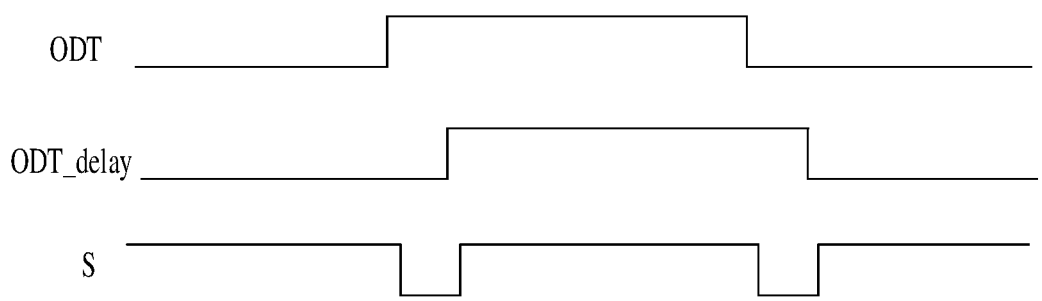
FIG. 9 illustrates a schematic sequential diagram of an ODT pin signal, an ODT time-delayed signal and a first intermediate signal according to embodiments of the disclosure.

Illustratively, with reference to FIG. 9, FIG. 9 illustrates a schematic sequential diagram of an ODT pin signal, an ODT time-delayed signal and a first intermediate signal according to embodiments of the disclosure. As shown in FIG. 9, ODT denotes the ODT pin signal, ODT_delay denotes the ODT time-delayed signal, and S denotes the first intermediate signal. As shown in FIG. 9, before the voltage level of the ODT pin signal is flipped over, the first intermediate signal is at high voltage level; the first intermediate signal is switched from high voltage level to low voltage level within preset time after the voltage level of the ODT pin signal is flipped over; and after the preset time, the first intermediate signal is switched from low voltage level to high voltage level.

It should be noted that due to the physical delay introduced by the XNOR gate circuit 7312, the time when the voltage level of the ODT pin signal is flipped over is not aligned with the time when the first intermediate signal is switched from high voltage level to low voltage level on the time axis.

Further, for second control sub-circuit 732, according to some embodiments as shown in FIG. 8, a second control sub-circuit 732 may include a latch 7321.

According to a specific embodiment, a latch 7321 may be an SR latch, and the SR latch consists of two two-input NAND gates.

According to embodiments of the disclosure, an SR latch is a flip-flop, which may be referred to a "reset/set flip-flop." The SR latch has two stable states, namely 1 and 0, which can also be called "bistable flip-flop". If there is no additional trigger signal, the SR latch will keep the original state unchanged, and the flip-flop has a memory function. Under the action of an external trigger signal, the output state of flip-flop may be switched, and the output state is directly controlled by an input signal.

It should be further noted that the SR latch includes two input terminals (S and R) and two output terminals (Q and QN). A first input terminal (S) denotes SET, i.e., a set terminal, and when the S terminal is at low voltage level, a first output terminal (Q) must be at high voltage level; and a second input terminal (R) denotes RST, i.e., a reset terminal, and the first output terminal (Q) must be at low voltage level when the S terminal is at high voltage level and the R terminal is at low voltage level.

Further, according to some embodiments as shown in FIG. 8, a control circuit 73 may further include a two-input NOR gate 733.

A selection circuit 72 is further configured to generate a target achievement signal. The target achievement signal is configured to indicate that a clock cycle count value reaches a clock cycle count target value.

The two-input NOR gate 733 is configured to perform NOR operation on the target achievement signal and a second setting signal to obtain a reset signal.

Herein, the second setting signal is generated according to MRS, and the second setting signal may be denoted by MRS_DIST. The second setting signal may include: when the second setting signal is at fifth voltage level, the ODT function of a chip is represented to be disabled; and when the second setting signal is at sixth voltage level, the ODT function of the chip is represented to be enabled.

According to a specific embodiment, the fifth voltage level is high voltage level and the sixth voltage level is low voltage level.

That is, if the second setting signal is at high voltage level, which means that the ODT function of the chip is disabled, an enable control circuit 70 of the disclosure does not need to be enabled; and if the second setting signal is at low voltage level, which means that the ODT function of the chip is enabled, an ODT pin signal needs to be further combined to determine whether the ODT path is enabled.

According to embodiments of the disclosure, for a second control sub-circuit 732, a first input terminal (S) of a latch 7321 is connected to an output terminal of a first control sub-circuit 731 and is configured to receive a first intermediate signal; a second input terminal (R) of the latch 7321 is connected to an output terminal of a two-input NOR gate 733 and is configured to receive a reset signal; and an output terminal (Q) of the latch 7321 is configured to output an ODT enable signal.

Herein, for the ODT enable signal, the ODT enable signal may be denoted by ODT_CLK_EN. The ODT enable signal may include: when the first intermediate signal is at low voltage level, the ODT enable signal must be at high voltage level; and when the first intermediate signal is at high voltage level and the reset signal is at low voltage level, the ODT enable signal is at low voltage level.

It should be further noted that if the second setting signal is at high voltage level, it can be determined that the reset signal is at low voltage level; and then, if the first intermediate signal is at high voltage level, the ODT enable signal can be controlled to be at low voltage level by resetting the latch, so that the ODT path is disabled.

Further, according to some embodiments as shown in FIG. 8, a control circuit 73 may further include a first NOT gate circuit 734, a second NOT gate circuit 735, and a three-input OR gate 736.

The first NOT gate circuit 734 is configured to receive a first intermediate signal and perform NOT operation on the first intermediate signal to obtain a second intermediate signal.

The second NOT gate circuit 735 is configured to receive an ODT enable signal and perform NOT operation on the ODT enable signal to obtain a third intermediate signal.

The three-input OR gate 736 is configured to perform OR operation on a second setting signal, the second intermediate signal, and the third intermediate signal to generate a count reset signal.

Herein, the count reset signal can be denoted by CNT_RST. After the count reset signal is obtained, the count reset signal can be input into a counter circuit 71. On one hand, the count reset signal can be directly used for the resetting and zeroing operation of the counter circuit 71, and on the other hand, a clock signal of the counter circuit 71 can be masked after logical operation is performed on the count reset signal.

Further, according to some embodiments as shown in FIG. 8, a counter circuit 71 may include an asynchronous binary counter 711.

According to a specific embodiment, an asynchronous binary counter 711 may include multiple flip-flops 7111 and the multiple flip-flops 7111 are connected in sequence.

According to the embodiment of the disclosure, the flip-flops 7111 are D flip-flops. An input terminal (D) of each flip-flop is connected to a second output terminal (denoted by Q-NOT, or QN) thereof, and the second output terminal (Q-NOT) of each flip-flop is connected to a clock terminal (CK) of a next flip-flop.

In addition, the flip-flop 7111 may further include a first output terminal (Q) and a reset terminal (RST).

The first output terminal (Q) of the flip-flop is configured to output a count signa.

The reset terminal (RST) of the flip-flop is configured to receive a count reset signal and control the count signal to be at low voltage level by resetting the flip-flop when the count reset signal is at high voltage level.

Specifically, the flip-flop 7111 belongs to a D flip-flop. Herein, D flip-flop (Data Flip-Flop or Delay Flip-Flop, DFF) is an information memory device with memory function and two stable states, which is the most basic logical unit of various sequential circuits and an important unit circuit in DLCs (Digital Logic Circuits). D flip-flop has two stable states, namely "0" and "1", which can be flipped over from one stable state to the other under the action of a certain external signal.

According to embodiments of the disclosure, flip-flop 7111 may include an input terminal (D), a clock terminal (CK), a reset terminal (RST), a first output terminal (Q) and a second output terminal (QN), and may further include a set terminal (SET). Herein, the set terminal can be connected to a ground terminal. According to a specific embodiment, a set terminal (SET) of the flip-flop is configured to receive a set signal, which may be a global grounding signal denoted by VSS!.

Further, according to some embodiments, as shown in FIG. 8, a counter circuit 71 may further include a clock control circuit 712.

The clock control circuit 712 is configured to receive a count reset signal and a clock signal and generate an internal clock signal.

Herein, the internal clock signal is connected to a clock terminal (CK) of a first flip-flop of the multiple flip-flops for supplying the clock signal to the counter circuit 71. The internal clock signal may include: the internal clock signal is stopped to be output, when the count reset signal is at seventh voltage level; and the internal clock signal is output, when the count reset signal is at eighth voltage level.

According to a specific embodiment, the seventh voltage level is high voltage level and the eighth voltage level is low voltage level.

Further, according to some embodiments as shown in FIG. 8, a clock control circuit 712 may include a third NOT gate circuit 7121 and a two-input AND gate 7122.

The third NOT gate circuit 7121 is configured to receive a count reset signal and perform NOT operation on the count reset signal to obtain a fourth intermediate signal.

The two-input AND gate 7122 is configured to receive the fourth intermediate signal and a clock signal, and perform AND operation on the fourth intermediate signal and the clock signal to obtain an internal clock signal.

It should be noted that, since the count reset signal is related to a second setting signal, if the second setting signal is at high voltage level, the count reset signal can be determined to be at high voltage level. Therefore, when the count reset signal is at high voltage level, an asynchronous binary counter 711 can be disabled to achieve the technical effect of saving power.

It should be further noted that the internal clock signal used by the counter circuit 71 itself is also controlled by the count reset signal, so that the internal clock signal used by the counter circuit is disabled because the count reset signal is at high voltage level after the counting is completed, thereby further saving power.

Further, in some embodiments, a selection circuit 72 is further configured to receive a first setting signal and at least two representation signals, and select one of the at least two representation signals as a target achievement signal according to the first setting signal; and the at least two representation signals respectively represent that clock cycle count value reaches different clock cycle count target values.

Herein, for the selection circuit 72, the first setting signal may be generated according to whether AL and/or PL are/is enabled and the first setting signal is denoted by AL_DIST.

Four situations will be described below that: neither AL nor PL is enabled; both AL and PL are enabled; AL is enabled and PL is not enabled; and PL is enabled and AL is not enabled.

In a possible implementation, a selection circuit 72 is specifically configured to, when a first setting signal indicates that neither AL nor PL is enabled, select a first representation signal as a target achievement signal and determine a clock cycle count target value to be a first value; and the first value is a value greater than or equal to CWL−2.

In another possible implementation, a selection circuit 72 is specifically configured to, when a first setting signal indicates that both AL and PL are enabled, select a second representation signal as a target achievement signal and determine a clock cycle count target value to be a second value; and the second value is a value greater than or equal to CWL+AL+PL−2.

In yet another possible implementation, a selection circuit 72 is specifically configured to, when a first setting signal indicates that AL is enabled and PL is not enabled, select a third representation signal as a target achievement signal and determine a clock cycle count target value to be a third value; and the third value is a value greater than or equal to CWL+AL−2.

In yet another possible implementation, a selection circuit 72 is specifically configured to, when a first setting signal indicates that PL is enabled and AL is not enabled, select a fourth representation signal as a target achievement signal and determine a clock cycle count target value to be a fourth value; and the fourth value is a value greater than or equal to CWL+PL−2.

Herein, the first representation signal represents that the clock cycle count value reaches the first value, the second representation signal represents that the clock cycle count value reaches the second value, the third representation signal represents that the clock cycle count value reaches the third value, and the fourth representation signal represents that the clock cycle count value reaches the fourth value.

It should be further noted that the values of CWL are shown in Table 3. As shown in Table 3, the maximum value of CWL is 20. The values of AL are shown in Table 4. As shown in Table 4, the maximum value of AL is CL−1. The values of CL are shown in Table 5. As shown in Table 5, the maximum value of CL is 32. Therefore, the maximum value of AL is 31. The values of PL are shown in Table 6. As shown in 6, the maximum value of PL is 8.

TABLE 3

| A5 | A4 | A3 | CWL | Operating Data Rate in MT/s for 1 tCK Write Preamble | | Operating Data Rate in MT/s for 1 tCK Write Preamble | |
|----|----|----|-----|---------|---------|---------|---------|
|    |    |    |     | 1st Set | 2nd Set | 1st Set | 2nd Set |
| 0 | 0 | 0 | 9  | 1600 |  |  |  |
| 0 | 0 | 1 | 10 | 1866 |  |  |  |
| 0 | 1 | 0 | 11 | 2133 | 1600 |  |  |
| 0 | 1 | 1 | 12 | 2400 | 1866 |  |  |
| 1 | 0 | 0 | 14 | 2666 | 2133 | 2400 |  |
| 1 | 0 | 1 | 16 | 2933/3200 | 2400 | 2666 | 2400 |
| 1 | 1 | 0 | 18 |  | 2666 | 2933/3200 | 2666 |
| 1 | 1 | 1 | 20 |  | 2933/3200 |  | 2933/3200 |

TABLE 4

| A4, A3 | Additive Latency (AL) | |
|---|---|---|
| | | 00 = 0 (AL disabled) |
| | | 01 = CL-1 |
| | | 10 = CL-2 |
| | | 11 = Reserved |

TABLE 5

| A12 | A6 | A5 | A4 | A2 | CAS Latency (CL) |
|---|---|---|---|---|---|
| 0 | 0 | 0 | 0 | 0 | 9 |
| 0 | 0 | 0 | 0 | 1 | 10 |
| 0 | 0 | 0 | 1 | 0 | 11 |
| 0 | 0 | 0 | 1 | 1 | 12 |
| 0 | 0 | 1 | 0 | 0 | 13 |
| 0 | 0 | 1 | 0 | 1 | 14 |
| 0 | 0 | 1 | 1 | 0 | 15 |
| 0 | 0 | 1 | 1 | 1 | 16 |
| 0 | 1 | 0 | 0 | 0 | 18 |
| 0 | 1 | 0 | 0 | 1 | 20 |
| 0 | 1 | 0 | 1 | 0 | 22 |
| 0 | 1 | 0 | 1 | 1 | 24 |
| 0 | 1 | 1 | 0 | 0 | 23 |
| 0 | 1 | 1 | 0 | 1 | 17 |
| 0 | 1 | 1 | 1 | 0 | 19 |
| 0 | 1 | 1 | 1 | 1 | 21 |
| 1 | 0 | 0 | 0 | 0 | 25 (only 3DS available) |
| 1 | 0 | 0 | 0 | 1 | 26 |
| 1 | 0 | 0 | 1 | 0 | 27 (only 3DS available) |
| 1 | 0 | 0 | 1 | 1 | 28 |
| 1 | 0 | 1 | 0 | 0 | Reserved for 29 |
| 1 | 0 | 1 | 0 | 1 | 30 |
| 1 | 0 | 1 | 1 | 0 | Reserved for 31 |
| 1 | 0 | 1 | 1 | 1 | 32 |
| 1 | 1 | 0 | 0 | 0 | Reserved |

TABLE 6

| A2 | A1 | A0 | PL | Speed Bin |
|---|---|---|---|---|
| 0 | 0 | 0 | Disable | |
| 0 | 0 | 1 | 4 | 1600, 1866, 2133 |
| 0 | 1 | 0 | 5 | 2400, 2666 |
| 0 | 1 | 1 | 6 | 2933, 3200 |
| 1 | 0 | 0 | 8 | RFU |
| 1 | 0 | 1 | Reserved | |
| 1 | 1 | 0 | Reserved | |
| 1 | 1 | 1 | Reserved | |

It should be noted that the above Tables 3 to 6 are derived from the relevant standard files of the DDR4 DRAM, in which A0, A1, A2, A3, A4, A5, A6 and A12 are bits in the corresponding MRs. According to Tables 3 to 6, it can be derived that the maximum value of CWL is 20, the maximum value of AL is 31, and the maximum value of PL is 8. Then, according to the selection circuit 72, when the first setting signal indicates that neither AL nor PL is enabled, the first value is larger than or equal to 18; when the first setting signal indicates that both AL and PL are enabled, the second value is a value greater than or equal to 57; when the first setting signal indicates that AL is enabled and PL is not enabled, the third value is a value greater than or equal to 49; and when the first setting signal indicates that PL is enabled and AL is not enabled, the fourth value is a value greater than or equal to 26. In this way, the clock cycle count target value can be determined.

In addition, for the enable control circuit 70, when the voltage level of an ODT pin signal is flipped over for the second time, the enable state of an ODT path can be further described below according to whether the interval between two consecutive flips of the voltage level of the ODT pin signal is greater than a clock cycle count target value.

In a possible implementation, assuming that the interval between two consecutive flips of the voltage level of an ODT pin signal is greater than a clock cycle count target value, a control circuit 73 is configured to control an ODT path to be enabled and start a counter circuit when the voltage level of the ODT pin signal is flipped over for the first time. When a clock cycle count value reaches the clock cycle count target value, the ODT path is controlled to be switched from being enabled to disabled, and the counter circuit is zeroed; and when the voltage level of the ODT pin signal is flipped over for the second time, the steps of controlling the ODT path to be enabled and starting the counter circuit are performed normally, and the ODT path can be enabled normally then.

In another possible implementation, assuming that the interval between two consecutive flips of the voltage level of an ODT pin signal is less than a clock cycle count target value, a control circuit 73 is further configured to control an ODT path to continue to be enabled, control a counter circuit to be zeroed and restart the counter circuit when a clock cycle count value does not reach the clock cycle count target value and the voltage level of the ODT pin signal is flipped over again. When the clock cycle count value obtained by recounting reaches the clock cycle count target value, the ODT path is controlled to be switched from being enabled to disabled.

In yet another possible implementation, assuming that the interval between two consecutive flips of the voltage level of a ODT pin signal is approximately equal to a clock cycle count target value, a control circuit 73 is further configured to control an ODT path to be switched from being enabled to disabled and control a counter circuit to be zeroed when a clock cycle count value reaches the clock cycle count target value. If the voltage level of the ODT pin signal is flipped over again, the ODT path is immediately controlled to be enabled again.

That is, for the enable control circuit 70, when the voltage level of the ODT pin signal is flipped over for two consecutive times, especially when the voltage level of the ODT pin signal is flipped over for the second time at some time, the interval of which is around the clock cycle count target value, the ODT path can still be ensured to be enabled then.

Briefly, embodiments of the disclosure provide an enable control circuit, including a counter circuit, a selection circuit, and a control circuit. The counter circuit is configured to count a current clock cycle and determine a clock cycle count value; the selection circuit is configured to determine a clock cycle count target value according to a first setting signal; and the control circuit is configured to control an ODT path to be enabled and start the counter circuit when the voltage level of the ODT pin signal is flipped over, control the ODT path to be switched from being enabled to disabled when the clock cycle count value reaches the clock cycle count target value and the voltage level of the ODT pin signal is not switched, and control the ODT path to continue to be enabled when the clock cycle count value reaches the clock cycle count target value and the voltage level of the ODT pin signal is flipped over again. In this way, the enable state of the ODT path is controlled according to whether the clock cycle count value reaches the clock cycle count target value, so that the ODT path can be enabled within certain time after the voltage level switch of the ODT pin signal is detected, i.e., the ODT path is enabled. After ensuring that the value switch of RTT is completed, the ODT path can be disabled, which can achieve the purpose of reducing current and saving power consumption. In addition, when the voltage level of the ODT pin signal is flipped over for two consecutive times, the problem that the ODT path cannot be enabled when the voltage level of the ODT pin signal is flipped over for the second time in some cases can also be solved.

According to another embodiment of the disclosure, with reference to FIG. 8, taking the situation that a counter circuit 71 includes six flip-flops and a selection circuit 72 receives only two representation signals as an example, the two representation signals are count signals output by a fifth flip-flop and a sixth flip-flop respectively.

According to some embodiments, a counter circuit 71 may include six flip-flops and the six flip-flops are connected in sequence.

A first output terminal (Q) of an i-th flip-flop is configured to output an i-th count signal, and i is an integer greater than 0 and less than or equal to 6.

A selection circuit 72 is specifically configured to receive a first setting signal, a fifth count signal and a sixth count signal, and select the fifth count signal and the sixth count signal according to the first setting signal to generate a target achievement signal; and two input terminals of the selection circuit are respectively connected to a first output terminal (Q) of a fifth flip-flop and a first output terminal (Q) of a sixth flip-flop.

It should be noted that the i-th count signal is denoted by Q<i>. In particular, the fifth count signal, which may be denoted by Q<5>, is output by the first output terminal (Q) of the fifth flip-flop; and the sixth count signal, which may be denoted by Q<6>, is output by the first output terminal (Q) of the sixth flip-flop.

It should be further noted that the selection circuit 72 receives only two representation signals (the fifth count signal and the sixth count signal), and then the first setting signal either indicates that neither AL nor PL is enabled, or indicates that at least one of AL and PL is enabled. Therefore, in a specific embodiment, the selection circuit 72 is further configured to determine that a target achievement signal is a fifth count signal and a clock cycle count target value is a first value when a first setting signal indicates that neither AL nor PL is enabled. Alternatively, the selection circuit 72 is further configured to determine that the target achievement signal is a sixth count signal and the clock cycle count target value is a second value when the first setting signal indicates that at least one of AL and PL is enabled.

It should be further noted that when neither AL nor PL is enabled, the clock cycle count target value (i.e., the first value) then is a value greater than or equal to 18; and when at least one of AL and PL is enabled, the clock cycle count target value (i.e., the second value) then is a value greater than or equal to 57. In addition, when the fifth count signal is switched to be at high voltage level (i.e., "1"), the clock cycle count value reaches 32; and when the sixth count signal is switched to be at high voltage level (i.e., "1"), the clock cycle count value reaches 64. Therefore, in a specific embodiment, a first value may be 32 and a second value may be 64.

Figure 10:
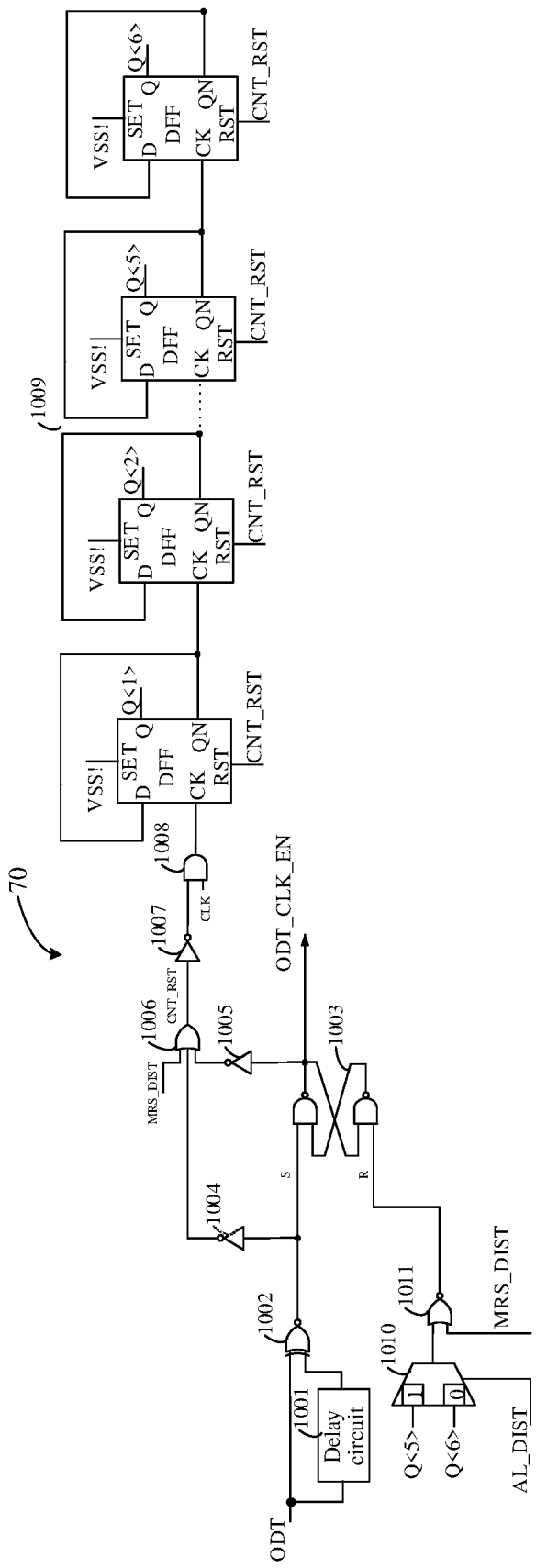
FIG. 10 illustrates a specific schematic structural diagram of a enable control circuit according to embodiments of the disclosure.

Illustratively, with reference to FIG. 10, FIG. 10 illustrates a schematic structural diagram of a specific enable control circuit 70 according to embodiments of the disclosure. As shown in FIG. 10, the enable control circuit 70 may include a delay circuit 1001, an XNOR gate 1002, an SR latch 1003, a first NOT gate 1004, a second NOT gate 1005, a three-input OR gate 1006, a third NOT gate 1007, a two-input AND gate 1008, an asynchronous binary counter 1009, a selection circuit 1010, and a two-input NOR gate 1011. The specific connection relationships are shown in FIG. 10. The asynchronous binary counter 1009 may include six flip-flops, and the flip-flops are D flip-flops, and an input terminal (D) of each flip-flop is connected to a second output terminal (QN) thereof, and the second output terminal (QN) of each flip-flop is connected to a clock terminal (CK) of a next flip-flop.

As shown in FIG. 10, an ODT pin signal is denoted by ODT, and a first intermediate signal output by the XNOR gate 1002 is connected to an S terminal of the SR latch 1003, which may be denoted by S; a reset signal output by the two-input NOR gate 1011 is connected to an R terminal of the SR latch 1003, which may be denoted by R; and an ODT enable signal output by a first output terminal (Q) of the SR latch 1003 is denoted by ODT_CLK_EN, a count reset signal output by the three-input OR gate 1006 is denoted by CNT_RST, and count signals output by the first output terminals (Q) of the six flip-flops are denoted by Q<1>, Q<2>, . . . , Q<5> and Q<6> in turn. In addition, CLK denotes a clock signal, AL_DIST denotes a first setting signal, MRS_DIST denotes a second setting signal, VSS! denotes a global grounding signal.

Therefore, according to the circuit structure shown in FIG. 10, due to the adoption of the SR latch, as long as the voltage level of ODT pin signal is changed, a pulse at low voltage level will inevitably appear in S, and ODT_CLK_EN will inevitably to be at high voltage level then, so as to ensure that the ODT path can be enabled.

In combination with sequential diagrams, three situations will be describes in terms of working principles in detail.

Figure 11:
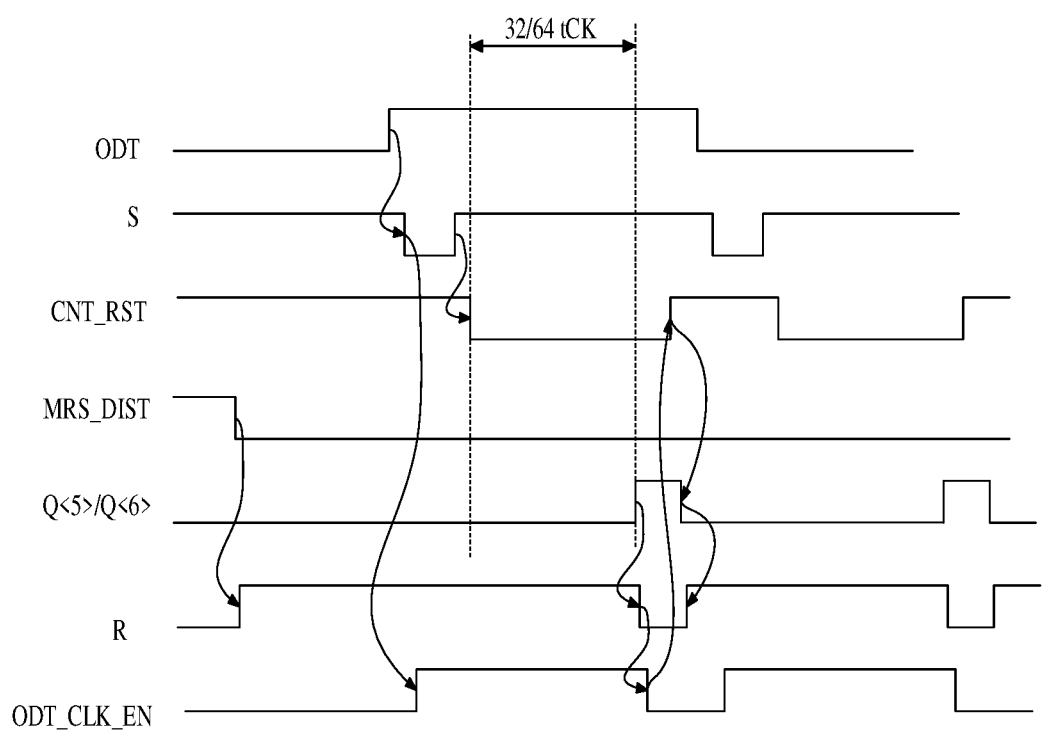
FIG. 11 illustrates a schematic sequential diagram of an enable control circuit according to embodiments of the disclosure.

In a first situation, assuming that the interval between two consecutive flips of the voltage level of the ODT pin signal is greater than a clock cycle count target value, i.e., when the interval between two consecutive flips of the voltage level of the ODT pin signal is greater than 32 tCK or 64 tCK, the sequential diagram then is shown in FIG. 11. In such situation, both flips of the voltage level of the ODT pin signal enable the ODT path normally.

Figure 12:
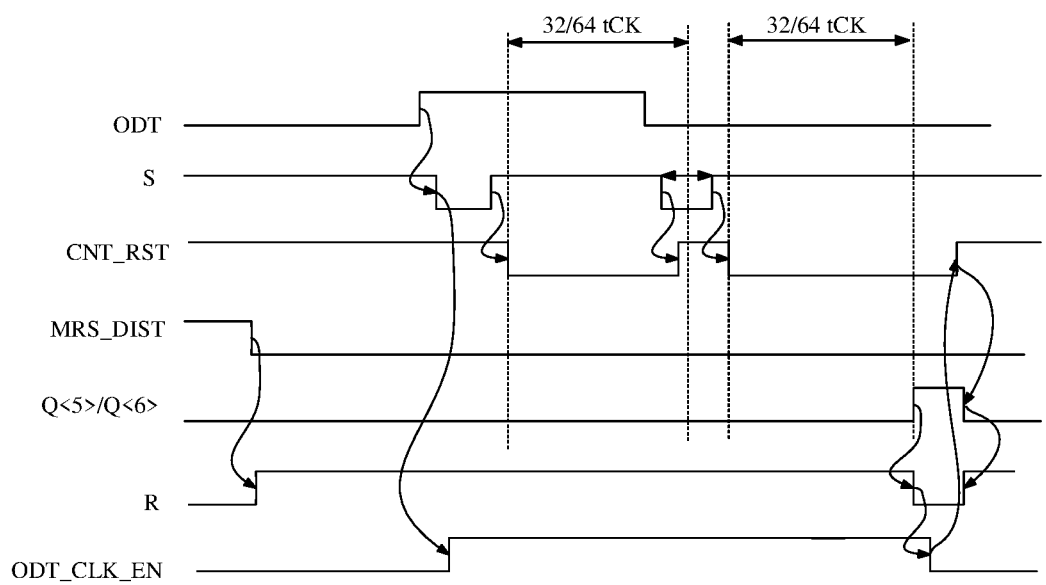
FIG. 12 illustrates a schematic sequential diagram of another enable control circuit according to embodiments of the disclosure.

In a second situation, assuming that the interval between two consecutive flips of the voltage level of the ODT pin signal is less than the clock cycle count target value, i.e., when the interval between two consecutive flips of the voltage level of the ODT pin signal is less than 32 tCK or 64 tCK, the sequential diagram then is shown in FIG. 12. Since the asynchronous binary counter 1009 has not yet counted to the clock cycle count target value, the voltage level of the ODT pin signal is flipped over for the second time, the counter is reset to be zeroed, and the counting is restarted until the clock cycle count value obtained by recounting reaches the clock cycle count target value of 32 tCK or 64 tCK, and then the ODT_CLK_EN can be switched to low voltage level to disable the ODT path.

Figure 13:
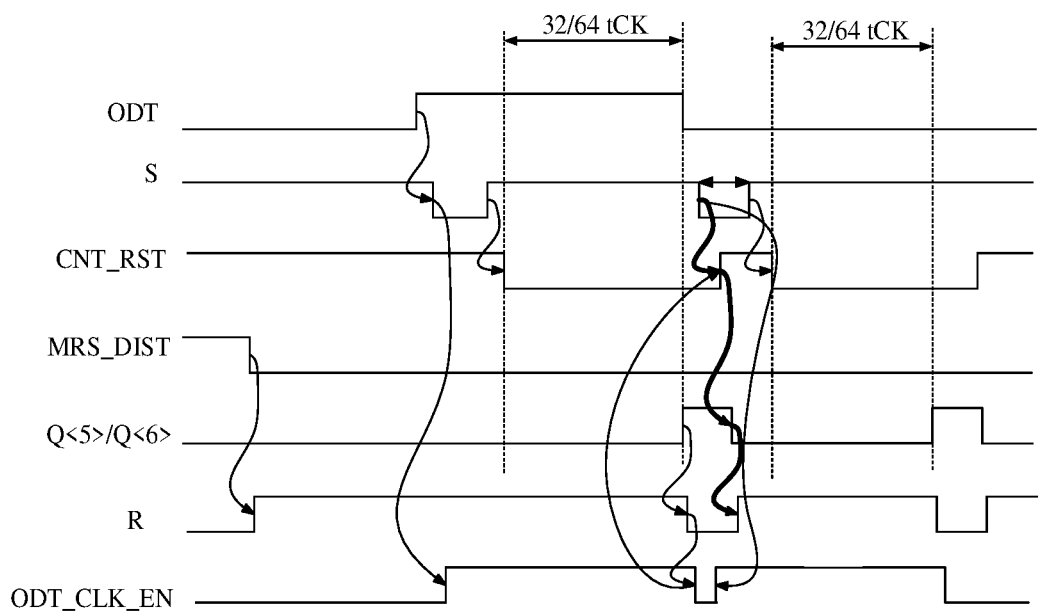
FIG. 13 illustrates a schematic sequential diagram of another enable control circuit according to embodiments of the disclosure.

In a third situation, assuming that the interval between two consecutive flips of the voltage level of the ODT pin signal is approximately equal to the clock cycle count target value, i.e., when the interval between two consecutive flips of the voltage level of the ODT pin signal is about 32 tCK or 64 tCK, the sequential diagram then is shown in FIG. 13. Although the counter counts to 32 tCK or 64 tCK after the voltage level of the ODT pin signal is flipped over for the first time, ODT_CLK_EN is made to be at low voltage level by making R at low voltage level. However, as long as the voltage level of the ODT pin signal is flipped over for the second time, S will be immediately switched to low voltage level, and then the output ODT_CLK_EN of the SR latch will be switched to high voltage level to enable the ODT path normally.

As shown in all the sequential diagrams of FIG. 11, FIG. 12, and FIG. 13, curves with arrows denote the causal relationship. Taking FIG. 13 as an example, when the ODT pin signal is flipped over (from low voltage level to high voltage level), the ODT pin signal is still at low voltage level after being delayed by the delay circuit 1001, and then both signals are input to the XNOR gate 1002 to output the signal at low voltage level, i.e., the S signal is switched from high voltage level to low voltage level. The reason why the ODT_CLK_EN signal is switched from low voltage level to high voltage level is that when the S signal of SR latch 1003 is switched to low voltage level, the output signal of the Q terminal thereof must be high voltage level, i.e., the ODT_CLK_EN signal is switched to high voltage level, so that the ODT path is enabled.

In addition, when the MRS_DIST signal is at low voltage level, and when the ODT pin signal passes through the delay circuit 1001 and the XNOR gate 1002, the signal at high voltage level is output, i.e., when the S signal is switched from low voltage level to high voltage level, the S signal is switched from high voltage level to low voltage level through the first NOT gate 1004, the signal output by the Q terminal of the SR latch 1003 is switched from high voltage level to low voltage level through the second NOT gate 1005, and the three signals are inputted to the three-input OR gate 1006 to output the signal at low voltage level, i.e., the CNT_RST signal is switched from high voltage level to low voltage level. Then, the asynchronous binary counter 1009 starts counting. Taking the clock cycle count target value of 32 tck as an example, when the clock cycle counts to 32 tck, the count value is switched to 010000, and the Q<5> signal is switched from low voltage level to high voltage level; and when neither AL nor PL is enabled and AL_DIST is at high voltage level, since the Q<5> signal is at high voltage level, the selection circuit 1010 outputs the signal at high voltage level, which, together with the MRS_DIST signal are input to the two-input NOR gate 1011, and then the signal at low voltage level is output, i.e., the R signal is switched to low voltage level. Or, taking the clock cycle count target value of 64 tck as an example, when the clock cycle counts to 64 tck, the count value is switched to 100000, and the Q<6> signal is switched from low voltage level to high voltage level; and when at least one of AL and PL is enabled and AL_DIST is at low voltage level, since the Q<6> signal is at high voltage level, the selection circuit 709 outputs the signal at high voltage level, which, together with the MRS_DIST signal are input to the two-input NOR gate 1011, and then the signal at low voltage level is output, i.e., the R signal is switched to low voltage level.

Further, when the S signal is at high voltage level and the R signal is at low voltage level, the SR latch 1003 is reset so that the output signal of the Q terminal of the SR latch 1003 must be at low voltage level, i.e., the ODT_CLK_EN signal is switched from high voltage level to low voltage level, so that the ODT path is disabled, thereby achieving the purpose of saving power. Then, when the ODT pin signal is flipped over again (from high voltage level to low voltage level), the time-delayed signal is still at high voltage level after being delayed by the delay circuit 1001, then after both signals are input to the XNOR gate 1002, the signal at low voltage level will be output, i.e., the S signal is switched from high voltage level to low voltage level. When the S signal of SR latch 1003 is switched to low voltage level, the output signal of the Q terminal of SR latch 1003 must be at high voltage level, i.e., the ODT_CLK_EN signal is switched from low voltage level to high voltage level again, so that the ODT path is enabled again.

In the foregoing process, when the S signal is switched from high voltage level to low voltage level, the S signal is switched from low voltage level to high voltage level through the first NOT gate 1004, and the CNT_RST signal is switched from low voltage level to high voltage level through the three-input OR gate 1006, so that the asynchronous binary counter 1009 can be disabled and zeroed, and the internal clock signal of the asynchronous binary counter can be disabled, so that the Q<5> or Q<6> signal is switched from high voltage level to low voltage level; and since the Q<5> or Q<6> signal is at low voltage level and the MRS_DIST signal is at low voltage level, the R signal is switched from low voltage level to high voltage level when the Q<5> or Q<6> signal and the MRS_DIST signal are input to the two-input NOR gate 1011.

Further, when the ODT path is enabled again, when the MRS_DIST signal is at low voltage level, and when the S signal is switched from low voltage level to high voltage level, the S signal is switched from high voltage level to low voltage level through the first NOT gate 1004, the output signal of the Q terminal of the SR latch 1003 is switched from high voltage level to low voltage level through the second NOT gate 1005, and the three signals are input to the three-input OR gate 1006 to output the signal at low voltage level, i.e., the CNT_RST signal is switched from high voltage level to low voltage level. Then, the asynchronous binary counter 1009 starts recounting, until the clock cycle count value obtained by recounting reaches the clock cycle count target value of 32 tck (or 64 tck), the count value then is switched to 010000 (or 100000), i.e., the Q<5> signal (or Q<6> signal) is switched from low voltage level to high voltage level, and then the R signal is switched from high voltage level to low voltage level again after passing through the selection circuit 1010 and the two-input NOR gate 1011. Since the S signal is at high voltage level and the R signal is at low voltage level, the output signal of the Q terminal of the SR latch 1003 must be at low voltage level, i.e., the ODT_CLK_EN signal is switched from high voltage level to low voltage level, so as to disable the ODT path again, thereby realizing the purpose of saving power.

It should be noted that, according to embodiments of the disclosure, the preset time of delay by a delay circuit 1001 needs to be controlled. In some embodiments, the preset time is greater than the sum of delays of a first delay, a second delay, and a third delay.

The first delay denotes the delay time between the switch of a first intermediate signal from first voltage level to second voltage level and the switch of a count reset signal from second voltage level to first voltage level.

The second delay denotes the delay time between the switch of a count reset signal from second voltage level to first voltage level and the switch of a count signal from first voltage level to second voltage level.

The third delay denotes the delay time between the switch of a count signal from first voltage level to second voltage level and the switch of a reset signal from second voltage level to first voltage level.

The second delay is the zeroing time of the asynchronous binary counter 1009. Specifically, the second delay denotes the delay time between the switch of the count reset signal from second voltage level to first voltage level and the switch of the count signal from first voltage level to second voltage level.

With reference to FIG. 13, according to embodiments of the disclosure, the delay of a delay circuit needs to be controlled such that the pulse width of an S signal is greater than the sum of delays of bold curves with arrows as shown in FIG. 13. Therefore, when a reset signal R returns to be at high voltage level, the S signal remains at the low voltage level, thereby preventing an ODT_CLK_EN signal from being set to low voltage level again and preventing an ODT path from being disabled.

It should be further noted that, as shown in FIG. 13, before a first curve with an arrow in FIG. 13, i.e., in the initial state, an MRS_DIST signal is at high voltage level, the ODT function of a chip is represented to be disabled, and then, the R signal is at low voltage level and the ODT_CLK_EN signal is at low voltage level. When the MRS_DIST signal is switched from high voltage level to low voltage level, the ODT function of the chip is represented to be enabled, and then the R signal will be switched to high voltage level; and when an ODT pin signal is not flipped over, the S signal remains at high voltage level and the ODT_CLK_EN signal remains at low voltage level, i.e. the ODT path is disabled.

Further, according to the embodiment of the disclosure, the circuit structure shown in FIG. 10 is to generate the enable signal ODT_CLK_EN of the ODT path. When the ODT_CLK_EN signal is at high voltage level, a clock signal of the ODT path can be enabled, thereby enabling the ODT path. When the ODT_CLK_EN signal is at low voltage level, the clock signal of the ODT path is disabled, thereby disabling the ODT path.

It should be noted that, the relationship between ODT delay and CWL, AL and PL can be known based on the above. In order to ensure ODT delay, the time when the ODT_CLK_EN is at high voltage level must ensure that the ODT path completes the shift of ODT delay. If neither AL nor PL is enabled, the maximum value of CWL may be 20 (DDR4 specification). Therefore, an asynchronous binary counter can be set to count to 32 tCK, and then the ODT_CLK_EN signal can be switched to low voltage level to disable the clock signal of the ODT path. If at least one of AL and PL is enabled, the maximum values that AL=31, PL=8, and CWL=20 are taken into account, so that the counter can be set to count to 64 tCK, and then the ODT_CLK_EN signal is switched to low voltage level to disable the clock signal of the ODT path, which not only ensures that the sequence of the ODT path can be realized, but also reduces the oscillation time of the clock signal of the ODT path and the current consumed by the ODT path.

It should be noted that, with reference to FIG. 10, the internal clock signal used by the asynchronous binary counter itself 1009 is also controlled by the CNT_RST signal. After the counting is completed, since the CNT_RST signal is at high voltage level, the internal clock signal used by the asynchronous binary counter 1009 is disabled, and the current consumed by the two-input AND gate 1008 is reduced, thereby further saving power.

The specific implementations of the foregoing embodiments are described in detail through the embodiment. According to the technical scheme of the embodiment, the enable state of the ODT path is controlled according to whether a clock cycle count value reaches a clock cycle count target value, so that the ODT path is controlled to be disabled when the ODT path does not need to work, thereby avoiding current waste and achieving the purpose of saving power consumption. In addition, when the voltage level of the ODT pin signal is flipped over for two consecutive times, the problem that the ODT path cannot be enabled when the voltage level of the ODT pin signal is flipped over for the second time in some cases can also be solved.

Figure 14:
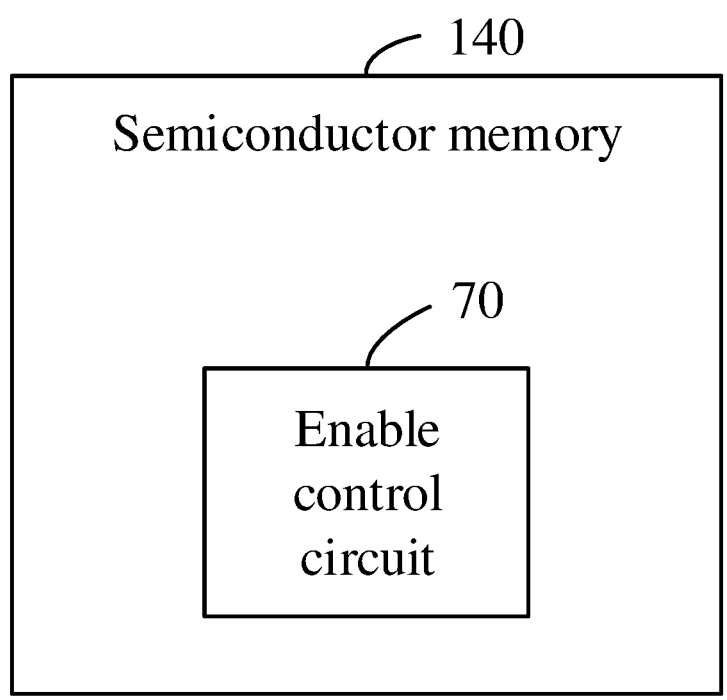
FIG. 14 illustrates a schematic structural diagram of components of a semiconductor memory according to embodiments of the disclosure.

According to yet another embodiment of the disclosure, with reference to FIG. 14, FIG. 14 illustrates a schematic structural diagram of components of a semiconductor memory 140 according to embodiments of the disclosure. As shown in FIG. 14, the semiconductor memory 140 may include an enable control circuit 70 as described in any of the foregoing embodiments.

According embodiments of the disclosure, a semiconductor memory 140 may be a DRAM chip.

Further, according to some embodiments, a DRAM chip conforms to the DDR4 memory specification.

According to embodiments of the disclosure, an enable control circuit 70 particularly relates to enable control of an ODT path in a DDR4 DRAM chip. The enable control circuit 70 can generate an enable signal to save power by controlling a clock signal of the ODT path.

Specifically, the semiconductor memory 140 includes the enable control circuit 70, the enable state of the ODT path is controlled according to whether a clock cycle count value reaches a clock cycle count target value, so that the ODT path is controlled to be disabled when the ODT path does not need to work, thereby avoiding current waste and achieving the purpose of saving power consumption. In addition, when the voltage level of the ODT pin signal is flipped over for two consecutive times, the problem that the ODT path cannot be enabled when the voltage level of the ODT pin signal is flipped over for the second time in some cases can also be solved.

The foregoing is merely a description of preferred embodiments of the disclosure and is not intended to limit the scope of the disclosure.

It should be noted that, according to the disclosure, the terms "comprising," "including," or any other variation thereof, are intended to be non-exclusive, such that a process, method, object, or device including a list of elements include not only those elements but also other elements not explicitly listed or inherent to such process, method, object, or device. Without further limitation, an element defined by the phrase "including a/an . . . " does not exclude the presence of other identical elements in the process, method, object, or device including the element.

It should be further noted that, according to the disclosure, singular forms "a/an", "one", and "the" may include the plural forms, unless otherwise specified types in the context. Meanwhile, in the specification, term "and/or" includes any and all combinations of the related listed items.

The foregoing serial numbers of the embodiments of the disclosure are merely for description and do not represent any superiority or inferiority of the embodiments.

The methods disclosed by the embodiments of disclosure in terms of methods can be combined with each other on a non-conflict basis to obtain embodiments of methods.

The features disclosed by the embodiments of disclosure in terms of products can be combined with each other on a non-conflict basis to obtain new embodiments of products.

The features disclosed by the embodiments of disclosure in terms of methods or devices can be combined with each other on a non-conflict basis to obtain new embodiments of methods or devices.

It should be noted that the foregoing is merely a description of the specific embodiments of the disclosure, and the scope of the disclosure is not limited thereto. Variations and substitutions within the technical scope of the disclosure are apparent to those skilled in the art, which shall be covered by the scope of the disclosure. The scope of the disclosure is determined by the scope of the claims.

INDUSTRIAL APPLICABILITY

According to embodiments of the disclosure, an enable control circuit includes a counter circuit, a selection circuit and a control circuit. The counter circuit is configured to count a current clock cycle and determine a clock cycle count value; the selection circuit is configured to determine a clock cycle count target value according to a first setting signal; and the control circuit is configured to control an ODT path to be enabled and start the counter circuit when the voltage level of an ODT pin signal is flipped over, control the ODT path to be switched from being enabled to disabled when the clock cycle count value reaches the clock cycle count target value and the voltage level of the ODT pin signal is not changed, and control the ODT path to continue to be enabled when the clock cycle count value reaches the clock cycle count target value and the voltage level of the ODT pin signal is flipped over again. In this way, the enable state of the ODT path is controlled according to whether the clock cycle count value reaches the clock cycle count target value, so that the ODT path is controlled to be disabled when the ODT path does not need to work, thereby avoiding current waste and achieving the purpose of saving power consumption. In addition, when the voltage level of the ODT pin signal is flipped over for two consecutive times, the problem that the ODT path cannot be enabled when the voltage level of the ODT pin signal is flipped over for the second time in some cases can also be solved.

What is claimed is:

1. An enable control circuit, comprising:
a counter circuit, configured to count a current clock cycle and determine a clock cycle count value;
a selection circuit, configured to determine a clock cycle count target value according to a first setting signal; and
a control circuit, connected to the counter circuit and the selection circuit, and configured to control an ODT path to be enabled and start the counter circuit when the voltage level of an ODT pin signal is flipped over, control the ODT path to be switched from being enabled to disabled when the clock cycle count value reaches the clock cycle count target value and the voltage level of the ODT pin signal is not changed, and control the ODT path to continue to be enabled when the clock cycle count value reaches the clock cycle count target value and the voltage level of the ODT pin signal is flipped over again.

2. The enable control circuit of claim 1, wherein,
the control circuit is further configured to control the ODT path to continue to be enabled, control the counter circuit to be zeroed and restart the counter circuit when the clock cycle count value does not reach the clock cycle count target value and the voltage level of the ODT pin signal is flipped over again, and control the ODT path to switched from being enabled to disabled when the clock cycle count value obtained by recounting reaches the clock cycle count target value.

3. The enable control circuit of claim 1, wherein the control circuit comprises a first control sub-circuit and a second control sub-circuit;
the first control sub-circuit is configured to generate a first intermediate signal according to the ODT pin signal, wherein the first intermediate signal is at a first voltage level before the voltage level of the ODT pin signal is flipped over; the first intermediate signal is switched from the first voltage level to a second voltage level within a preset time after the voltage level of the ODT pin signal is flipped over; and the first intermediate signal is switched from the second voltage level to the first voltage level after the preset time; and
the second control sub-circuit is configured to perform logical operation on the first intermediate signal to generate an ODT enable signal, wherein when the ODT enable signal is at the third voltage level, the ODT path is controlled to be enabled; and when the ODT enable signal is at the fourth voltage level, the ODT path is controlled to be disabled.

4. The enable control circuit of claim 3, wherein the first control sub-circuit comprises a delay circuit and an XNOR gate circuit;
the delay circuit is configured to delay the ODT pin signal by the preset time to obtain an ODT time-delayed signal; and
the XNOR gate circuit is configured to perform XNOR operation on the ODT pin signal and the ODT time-delayed signal to obtain the first intermediate signal.

5. The enable control circuit of claim 3, wherein the control circuit further comprises a two-input NOR gate;
the selection circuit is further configured to generate a target achievement signal, wherein the target achievement signal is configured to indicate that the clock cycle count value reaches the clock cycle count target value; and
the two-input NOR gate is configured to perform NOR operation on the target achievement signal and a second setting signal to obtain a reset signal, wherein the second setting signal is generated according to Mode Register Set (MRS), and the ODT function of a chip is represented to be disabled when the second setting signal is at a fifth voltage level; and the ODT function of the chip is represented to be enabled when the second setting signal is at a sixth voltage level.

6. The enable control circuit of claim 5, wherein the second control sub-circuit comprises a latch, wherein the latch is an SR latch, and the SR latch consists of two two-input NAND gates, wherein,
a first input terminal (S) of the latch is connected to an output terminal of the first control sub-circuit and is configured to receive the first intermediate signal; a second input terminal (R) of the latch is connected to an output terminal of the two-input NOR gate and is configured to receive the reset signal; an output terminal (Q) of the latch is configured to output the ODT enable signal, wherein when the first intermediate signal is at a low voltage level, the ODT enable signal is at a high voltage level; and when the first intermediate signal is at a high voltage level and the reset signal is at a low voltage level, the ODT enable signal is at a low voltage level.

7. The enable control circuit of claim 5, wherein the control circuit further comprises a first NOT gate circuit, a second NOT gate circuit, and a three-input OR gate;
the first NOT gate circuit is configured to receive the first intermediate signal and perform NOT operation on the first intermediate signal to obtain a second intermediate signal;
the second NOT gate circuit is configured to receive the ODT enable signal and perform NOT operation on the ODT enable signal to obtain a third intermediate signal; and
the three-input OR gate is configured to perform OR operation on the second setting signal, the second intermediate signal and the third intermediate signal to generate a count reset signal.

8. The enable control circuit of claim 7, wherein the counter circuit comprises an asynchronous binary counter, the asynchronous binary counter comprises multiple flip-flops, and the multiple flip-flops are connected in sequence.

9. The enable control circuit of claim 8, wherein the flip-flops are D flip-flops, wherein an input terminal (D) of each flip-flop is connected to a second output terminal (QN) of the flip-flop and the second output terminal (QN) of each flip-flop is connected to a clock terminal (CK) of a next flip-flop,
- wherein the flip-flop further comprises a first output terminal (Q) and a reset terminal (RST);
- the first output terminal of the flip-flop is configured to output a count signal; and
- the reset terminal of the flip-flop is configured to receive the count reset signal and control the count signal to be at a low voltage level by resetting the flip-flop when the count reset signal is at a high voltage level.

10. The enable control circuit of claim 9, wherein the counter circuit further comprises a clock control circuit; and
- the clock control circuit is configured to receive the count reset signal and a clock signal and generate an internal clock signal, wherein the internal clock signal is connected to a clock terminal (CK) of a first flip-flop of the multiple flip-flops, and the internal clock signal is stopped to be output when the count reset signal is at a seventh voltage level; and the internal clock signal is output when the count reset signal is at an eighth voltage level.

11. The enable control circuit of claim 10, wherein the first voltage level is a high voltage level, the second voltage level is a low voltage level, the third voltage level is a high voltage level, and the fourth voltage level is a low voltage level, wherein the fifth voltage level is a high voltage level, the sixth voltage level is a low voltage level, the seventh voltage level is a high voltage level and the eighth voltage level is a low voltage level.

12. The enable control circuit of claim 10, wherein the clock control circuit comprises a third NOT gate circuit and a two-input AND gate;
- the third NOT gate circuit is configured to receive the count reset signal and perform NOT operation on the count reset signal to obtain a fourth intermediate signal; and
- the two-input AND gate is configured to receive the fourth intermediate signal and the clock signal, and perform AND operation on the fourth intermediate signal and the clock signal to obtain the internal clock signal.

13. The enable control circuit of claim 9, wherein the preset time is greater than a sum of a first delay, a second delay, and a third delay;
- the first delay denotes a delay time between a switch of the first intermediate signal from the first voltage level to the second voltage level and a switch of the count reset signal from the second voltage level to the first voltage level;
- the second delay denotes a delay time between a switch of the count reset signal from the second voltage level to the first voltage level and a switch of the count signal from the first voltage level to the second voltage level; and
- the third delay denotes a delay time between a switch of the count signal from the first voltage level to the second voltage level and a switch of the reset signal from the second voltage level to the first voltage level.

14. The enable control circuit of claim 5, wherein,
- the selection circuit is further configured to receive the first setting signal and at least two representation signals, and select one of the at least two representation signals as the target achievement signal according to the first setting signal, wherein the at least two representation signals respectively represent that the clock cycle count value reaches different clock cycle count target values.

15. The enable control circuit of claim 14, wherein,
- the selection circuit is specifically configured to, when the first setting signal indicates that neither Additive Latency (AL) nor Parity Latency (PL) is enabled, select a first representation signal as the target achievement signal and determine the clock cycle count target value to be a first value, wherein the first value is a value greater than or equal to CAS Write Latency (CWL)−2; or,
- the selection circuit is specifically configured to, when the first setting signal indicates that both AL and PL are enabled, select a second representation signal as the target achievement signal and determine the clock cycle count target value to be a second value, wherein the second value is a value greater than or equal to CWL+AL+PL−2; or,
- the selection circuit is specifically configured to, when the first setting signal indicates that AL is enabled and PL is not enabled, select a third representation signal as the target achievement signal and determine the clock cycle count target value to be a third value, wherein the third value is a value greater than or equal to CWL+AL−2; or,
- the selection circuit is specifically configured to, when the first setting signal indicates that PL is enabled and AL is not enabled, select a fourth representation signal as the target achievement signal and determine the clock cycle count target value to be a fourth value, wherein the fourth value is a value greater than or equal to CWL+PL−2; and
- the first representation signal represents that the clock cycle count value reaches the first value, the second representation signal represents that the clock cycle count value reaches the second value, the third representation signal represents that the clock cycle count value reaches the third value, and the fourth representation signal represents that the clock cycle count value reaches the fourth value.

16. The enable control circuit of claim 15, wherein the counter circuit comprises six flip-flops, and the six flip-flops are connected in sequence;
- a first output terminal of an i-th flip-flop is configured to output an i-th count signal, wherein i is an integer greater than 0 and less than or equal to 6; and
- the selection circuit is specifically configured to receive the first setting signal, a fifth count signal and a sixth count signal, and select the fifth count signal and the sixth count signal according to the first setting signal to generate the target achievement signal, wherein two input terminals of the selection circuit are respectively connected to a first output terminal of a fifth flip-flop and a first output terminal of a sixth flip-flop.

17. The enable control circuit of claim 16, wherein,
- the selection circuit is further configured to, when the first setting signal indicates that neither AL nor PL is enabled, determine the target achievement signal to be the fifth count signal and determine the clock cycle count target value to be the first value; or,
- the selection circuit is further configured to, when the first setting signal indicates that at least one of AL and PL is enabled, determine the target achievement signal to be the sixth count signal and determine the clock cycle count target value to be the second value.

18. The enable control circuit of claim 17, wherein the first value is 32 and the second value is 64.

19. A semiconductor memory comprising an enable control circuit, wherein the enable control circuit comprises:
a counter circuit, configured to count a current clock cycle and determine a clock cycle count value;
a selection circuit, configured to determine a clock cycle count target value according to a first setting signal; and
a control circuit, connected to the counter circuit and the selection circuit, and configured to control an ODT path to be enabled and start the counter circuit when the voltage level of an ODT pin signal is flipped over, control the ODT path to be switched from being enabled to disabled when the clock cycle count value reaches the clock cycle count target value and the voltage level of the ODT pin signal is not changed, and control the ODT path to continue to be enabled when the clock cycle count value reaches the clock cycle count target value and the voltage level of the ODT pin signal is flipped over again.

20. The semiconductor memory of claim 19, wherein the semiconductor memory is a Dynamic Random Access Memory (DRAM) chip,
wherein the DRAM chip conforms to a 4th Double Data Rate (DDR4) memory specification.

\* \* \* \* \*